US 6,372,039 B1

(12) United States Patent
Okumura et al.

(10) Patent No.: US 6,372,039 B1
(45) Date of Patent: Apr. 16, 2002

(54) METHOD AND APPARATUS FOR IRRADIATION OF A PULSE LASER BEAM

(75) Inventors: Hiroshi Okumura; Hiroshi Tanabe, both of Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/273,489

(22) Filed: Mar. 22, 1999

(30) Foreign Application Priority Data

Mar. 20, 1998 (JP) .......................................... 10-072338

(51) Int. Cl.$^7$ ................................................ C30B 28/02
(52) U.S. Cl. ........................... 117/8; 117/10; 438/487; 438/488
(58) Field of Search .................... 117/8, 10, 7, 909; 438/487, 488, 486, 166, 795, 378; 250/492.2

(56) References Cited

U.S. PATENT DOCUMENTS 6,187,088 B1 * 2/2001 Okumura ....................... 117/8

FOREIGN PATENT DOCUMENTS

JP          1064815         6/1998

* cited by examiner

*Primary Examiner*—Kiet T. Nguyen
(74) *Attorney, Agent, or Firm*—Young & Thompson

(57) ABSTRACT

A method and device for irradiating a pulse laser beam having a linear shape and a rectangular shape beam spot onto a non-single crystal semiconductor thin film. The method includes scanning the pulse laser beam so that previous and next beam spots are partially overlapped. The laser beam has a profile which includes: a first beam profile region having a first energy density which is lower than a micro-crystallization threshold value Ea of an amorphous semiconductor for forming a polycrystallization region; a second beam profile region having a second energy density which is not lower than the micro-crystallization threshold value Ea and is lower than a micro-crystallization threshold value Ep of a polycrystalline semiconductor for forming a first micro-polycrystallization region from an amorphous semiconductor region; and a third beam profile region having a third energy density which is not lower than the micro-crystallization threshold value Ep for forming a second micro-polycrystallization region from a polycrystalline semiconductor region.

14 Claims, 12 Drawing Sheets

Prior art
FIG. 2A
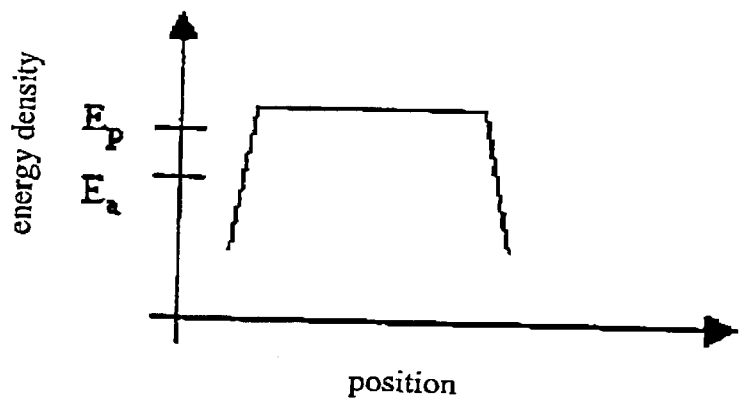
FIG. 2B
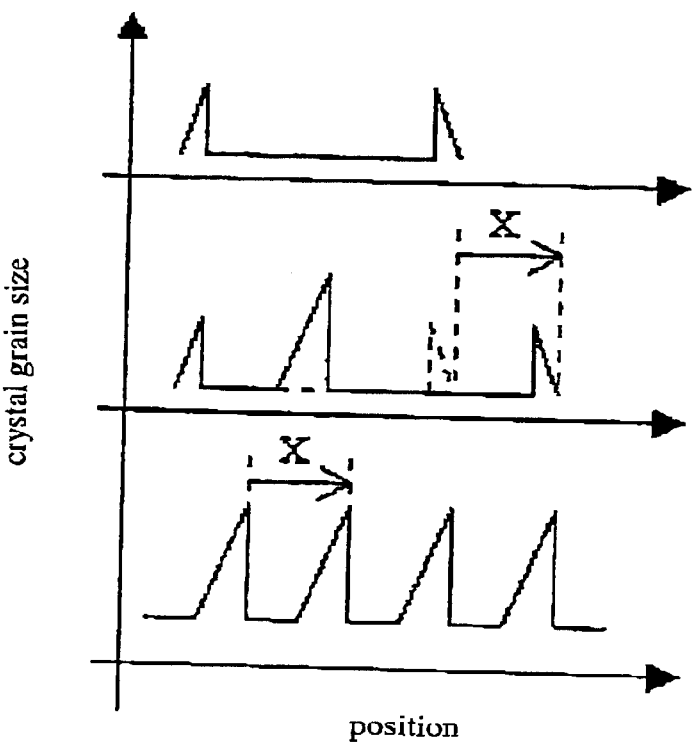
FIG. 2C
FIG. 2D

FIG. 3A
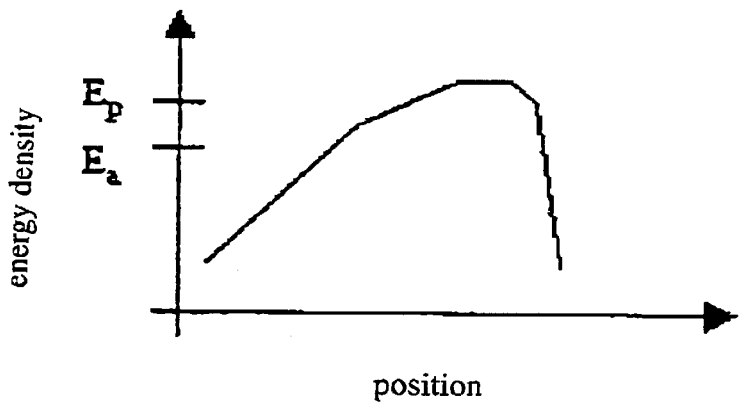
FIG. 3B
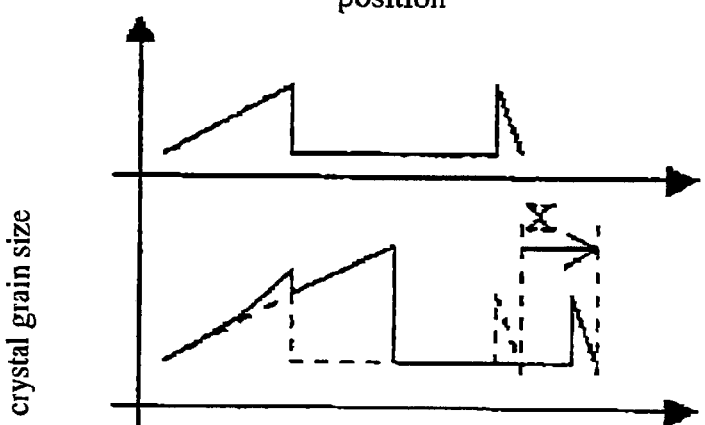
FIG. 3C
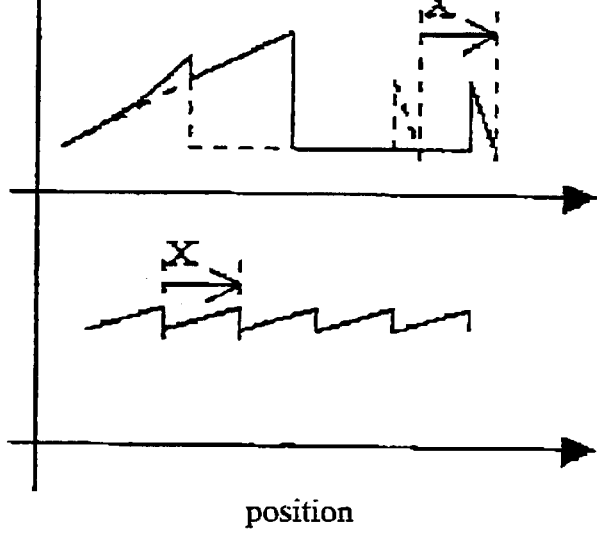
FIG. 3D

FIG. 6A
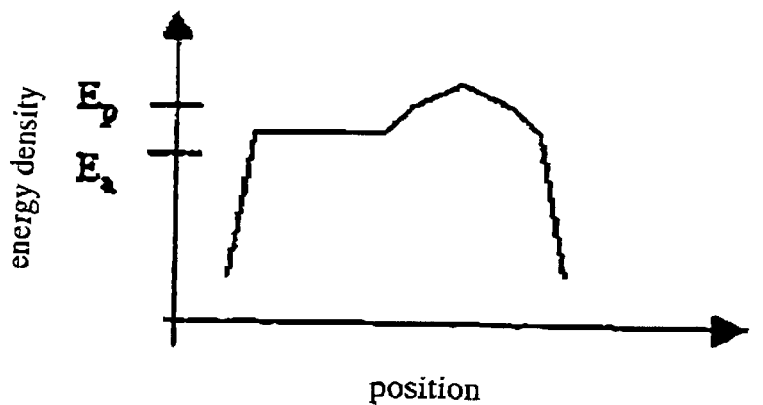
FIG. 6B
FIG. 6C
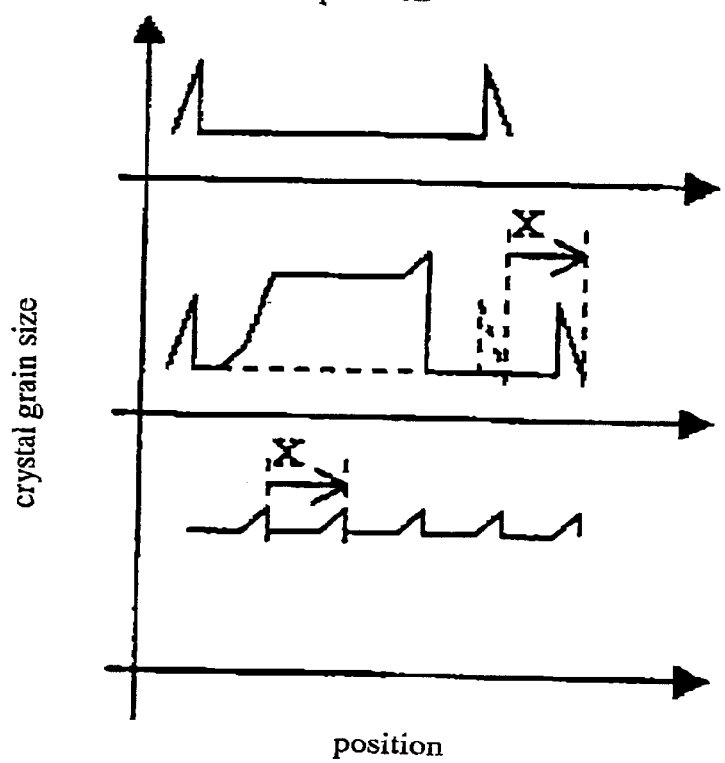
FIG. 6D

METHOD AND APPARATUS FOR IRRADIATION OF A PULSE LASER BEAM

BACKGROUND OF THE INVENTION

The present invention relates to a method irradiation of a laser onto a non-single crystal semiconductor thin film for annealing the same, and a laser irradiation device, and more particularly to a method of irradiation of a pulse laser onto a polycrystal semiconductor thin film for forming an active layer of a polycrystal silicon thin film transistor used for a liquid crystal display and a contact image sensor and a pulse laser irradiation device.

The thin film transistor has an active layer of a polycrystal silicon thin film formed on a glass substrate. The thin film transistor may be used for the liquid crystal display and the contact image sensor or other electronic devices. A laser anneal method has been often used in view of reduction in process temperature and improvement in throughput. A silicon thin film is once formed as a precursor and then an ultraviolet ray pulse laser beam is irradiated onto the silicon thin film for causing crystallization to polycrystalline structure. It is widely used that a linear pulse laser beam is scanned in a width direction perpendicular to the line direction.

The conventional laser beam irradiation method has a problem in low uniformity. An influence of a pulse laser beam edge of the previously irradiated pulse laser beam causes a large variation in crystal grain diameters to be formed in the next laser beam irradiation. A melting state of the thin film by the laser beam irradiation depends upon the thin film crystal structure before the laser beam irradiation. Particularly, when amorphous silicon thin film is used as a precursor, a remarkable variation in melting state may appear on a boundary between the crystal region already irradiated with the laser beam and the amorphous region unirradiated with the laser beam.

FIG. 1A is a diagram illustrative of a variation in energy density over position of a pulse laser beam with a top flat energy density profile to be irradiated onto an amorphous silicon thin film for annealing the same. FIG. 1B is a diagram illustrative of a distribution in crystal grain size over position of a polycrystalline region formed by irradiation of a pulse laser beam with the energy density profile of FIG. 1A onto the amorphous silicon thin film. FIG. 1C is a diagram illustrative of a change of distribution in crystal grain size over position of the polycrystalline region by scanning at a pitch "x" the pulse laser beam, wherein the crystal grain size has a minimum size value in the vicinity of the laser beam of FIG. 1B. FIG. 1D is a diagram illustrative of a final distribution in crystal grain size over position of the polycrystalline region after scanned at a pitch "x" the pulse laser beam, wherein the crystal grain size varied over position.

FIG. 2A is a diagram illustrative of a variation in energy density over position of a pulse laser beam with a top flat energy density profile to be irradiated onto an amorphous silicon thin film for annealing the same wherein a maximum energy density is beyond a micro-crystallization threshold value of the polysilicon film. FIG. 2B is a diagram illustrative of a distribution in crystal grain size over position of a polycrystalline region formed by irradiation of a pulse laser beam with the energy density profile of FIG. 2A onto the amorphous silicon thin film. FIG. 2C is a diagram illustrative of a change of distribution in crystal grain size over position of the polycrystalline region by scanning at a pitch "x" the pulse laser beam, wherein the crystal grain size has a minimum size value in the vicinity of the laser beam of FIG. 2B. FIG. 2D is a diagram illustrative of a final distribution in crystal grain size over position of the polycrystalline region after scanned at a pitch "x" the pulse laser beam, wherein the crystal grain size varied over position.

In Japanese laid-open patent publication No. 9-219380, it is disclosed that in order to improve the uniformity of crystal grain size of the polysilicon thin film, a pulse laser beam having a step-like energy density profile is irradiated onto the amorphous silicon thin film. Even the irradiation of the pulse laser beam having the step-like energy density profile onto the amorphous silicon thin film causes variation or change in crystal grain size at the beam edge positions, for which reason it is difficult to obtain the required uniformity in crystal grain size of the polysilicon region.

In the above circumstances, it had been required to develop a novel method of irradiation of a laser onto a non-single crystal semiconductor thin film for annealing the same free from the above problem, and a laser irradiation device.

method of irradiation of a pulse laser onto a polycrystal semiconductor thin film for forming an active layer of a polycrystal silicon thin film transistor used for a liquid crystal display and a contact image sensor and a pulse laser irradiation device.

SUMMARY OF THE INVENTION

Accordingly, it is an object of the present invention to provide a novel method of irradiation of a laser onto a non-single crystal semiconductor thin film for annealing the same free from the above problems.

It is a further object of the present invention to provide a novel method of irradiation of a laser onto a non-single crystal semiconductor thin film for annealing the same free from any influence of a pulse laser beam edge previously irradiated.

It is still a further object of the present invention to provide a novel method of irradiation of a laser onto a non-single crystal semiconductor thin film for annealing the same to obtain a uniformity in crystal grain size.

It is yet further object of the present invention to provide a novel device of irradiation of a laser onto a non-single crystal semiconductor thin film for annealing the same free from the above problems.

It is a further more object of the present invention to provide a novel device of irradiation of a laser onto a non-single crystal semiconductor thin film for annealing the same free from any influence of a pulse laser beam edge previously irradiated.

It is still more object of the present invention to provide a novel device of irradiation of a laser onto a non-single crystal semiconductor thin film for annealing the same to obtain a uniformity in crystal grain size.

It is moreover object of the present invention to provide a novel method of irradiation of a pulse laser onto a polycrystal semiconductor thin film for forming an active layer of a polycrystal silicon thin film transistor used for a liquid crystal display and a contact image sensor free from the above problems.

It is another object of the present invention to provide a novel method of irradiation of a pulse laser onto a polycrystal semiconductor thin film for forming an active layer of a polycrystal silicon thin film transistor used for a liquid crystal display and a contact image sensor free from any influence of a pulse laser beam edge previously irradiated.

It is still another object of the present invention to provide a novel method of irradiation of a pulse laser onto a polycrystal semiconductor thin film for forming an active layer of a polycrystal silicon thin film transistor used for a liquid crystal display and a contact image sensor to obtain a uniformity in crystal grain size.

It is yet another object of the present invention to provide a novel device of irradiation of a pulse laser onto a polycrystal semiconductor thin film for forming an active layer of a polycrystal silicon thin film transistor used for a liquid crystal display and a contact image sensor free from the above problems.

It is further another object of the present invention to provide a novel device of irradiation of a pulse laser onto a polycrystal semiconductor thin film for forming an active layer of a polycrystal silicon thin film transistor used for a liquid crystal display and a contact image sensor free from any influence of a pulse laser beam edge previously irradiated.

It is an additional object of the present invention to provide a novel device of irradiation of a pulse laser onto a polycrystal semiconductor thin film for forming an active layer of a polycrystal silicon thin film transistor used for a liquid crystal display and a contact image sensor to obtain a uniformity in crystal grain size.

In accordance with the present invention, there is provided a method of irradiation of a pulse laser beam having a linear shape and a rectangular shape beam spot onto a non-single crystal semiconductor thin film with scanning the pulse laser beam so that previous and next beam spots are partially overlapped, wherein the laser beam has a beam profile which includes: a first beam profile region having a first energy density which is lower than a micro-crystallization threshold value Ea of an amorphous semiconductor for forming a polycrystallization region; a second beam profile region having a second energy density which is not lower than the micro-crystallization threshold value Ea and is lower than a micro-crystallization threshold value Ep of a polycrystalline semiconductor for forming a first micro-polycrystallization region from an amorphous semiconductor region; and a third beam profile region having a third energy density which is not lower than the micro-crystallization threshold value Ep for forming a second micro-polycrystallization region from a polycrystalline semiconductor region.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

FIG. 2A is a diagram illustrative of a variation in energy density over position of a pulse laser beam with a top flat energy density profile to be irradiated onto an amorphous silicon thin film for annealing the same wherein a maximum energy density is beyond a micro-crystallization threshold value of the polysilicon film.

FIG. 2B is a diagram illustrative of a distribution in crystal grain size over position of a polycrystalline region formed by irradiation of a pulse laser beam with the energy density profile of FIG. 2A onto the amorphous silicon thin film.

FIG. 2C is a diagram illustrative of a change of distribution in crystal grain size over position of the polycrystalline region by scanning at a pitch "x" the pulse laser beam, wherein the crystal grain size has a minimum size value in the vicinity of the laser beam of FIG. 2B.

FIG. 2D is a diagram illustrative of a final distribution in crystal grain size over position of the polycrystalline region after scanned at a pitch "x" the pulse laser beam, wherein the crystal grain size varied over position.

FIG. 3A is a diagram illustrative of a variation in energy density over position of a novel pulse laser beam with a top non-flat energy density profile to be irradiated onto an amorphous silicon thin film for annealing the same in a first embodiment in accordance with the present invention.

FIG. 3B is a diagram illustrative of a distribution in crystal grain size over position of a polycrystalline region formed by irradiation of a pulse laser beam with the energy density profile of FIG. 3A onto the amorphous silicon thin film in a first embodiment in accordance with the present invention.

FIG. 3C is a diagram illustrative of a change of distribution in crystal grain size over position of the polycrystalline region by a single time movement of the pulse laser beam at a pitch "x" the pulse laser beam, wherein the crystal grain size has a minimum size value in the vicinity of the laser beam of FIG. 3B in a first embodiment in accordance with the present invention.

FIG. 3D is a diagram illustrative of a final distribution in crystal grain size over position of the polycrystalline region after scanned at a pitch "x" the pulse laser beam, wherein the crystal grain size varied over position in a first embodiment in accordance with the present invention.

FIG. 6A is a diagram illustrative of a variation in energy density over position of a novel pulse laser beam with a top non-flat energy density profile to be irradiated onto an amorphous silicon thin film for annealing the same in a second embodiment in accordance with the present invention.

FIG. 6B is a diagram illustrative of a distribution in crystal grain size over position of a polycrystalline region formed by irradiation of a pulse laser beam with the energy density profile of FIG. 6A onto the amorphous silicon thin film in a second embodiment in accordance with the present invention.

FIG. 6C is a diagram illustrative of a change of distribution in crystal grain size over position of the polycrystalline region by a single time movement of the pulse laser beam at a pitch "x" the pulse laser beam, wherein the crystal grain size has a minimum size value in the vicinity of the laser beam of FIG. 6B in a second embodiment in accordance with the present invention.

FIG. 6D is a diagram illustrative of a final distribution in crystal grain size over position of the polycrystalline region after scanned at a pitch "x" the pulse laser beam, wherein the crystal grain size varied over position in a second embodiment in accordance with the present invention.

DISCLOSURE OF THE INVENTION

Figure 1A:
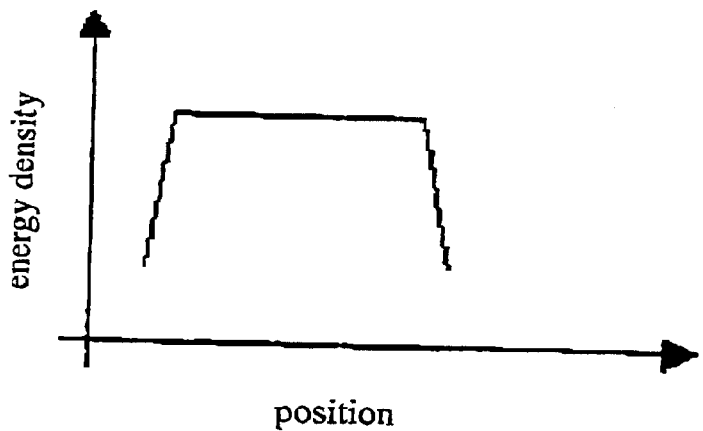
FIG. 1A is a diagram illustrative of a variation in energy density over position of a pulse laser beam with a top flat energy density profile to be irradiated onto an amorphous silicon thin film for annealing the same.
Figure 1B:
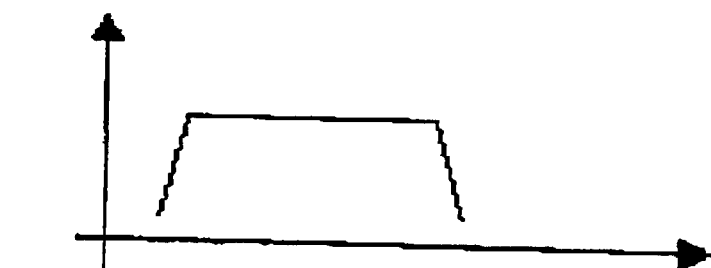
FIG. 1B is a diagram illustrative of a distribution in crystal grain size over position of a polycrystalline region formed by irradiation of a pulse laser beam with the energy density profile of FIG. 1A onto the amorphous silicon thin film.
Figure 1C:
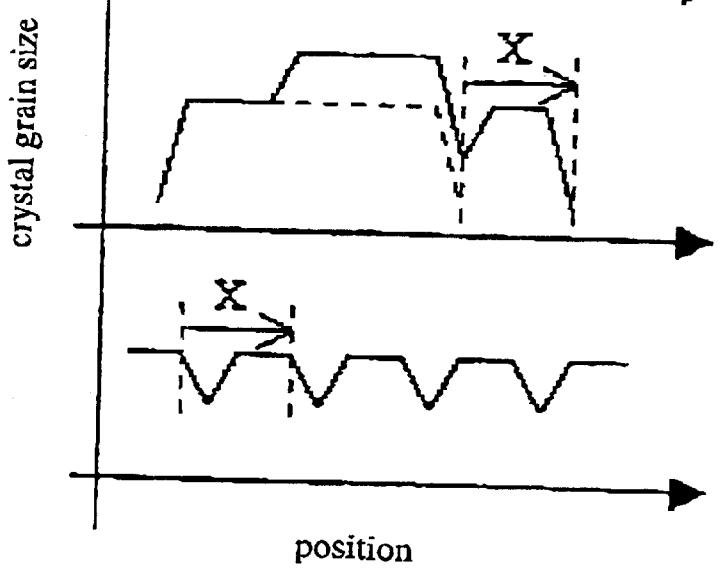
FIG. 1C is a diagram illustrative of a change of distribution in crystal grain size over position of the polycrystalline region by scanning at a pitch "x" the pulse laser beam, wherein the crystal grain size has a minimum size value in the vicinity of the laser beam of FIG. 1B.

In accordance with the present invention, there is provided a method of irradiation of a pulse laser beam having a linear shape and a rectangular shape beam spot onto a non-single crystal semiconductor thin film with scanning the pulse laser beam so that previous and next beam spots are partially overlapped, wherein the laser beam has a beam profile which includes: a first beam profile region having a first energy density which is lower than a micro-crystallization threshold value Ea of an amorphous semiconductor for forming a polycrystallization region; a second beam profile region having a second energy density which is not lower than the micro-crystallization threshold value Ea and is lower than a micro-crystallization threshold value Ep of a polycrystalline semiconductor for forming a first micro-polycrystallization region from an amorphous semiconductor region; and a third beam profile region having a third energy density which is not lower than the micro-crystallization threshold value Ep for forming a second micro-polycrystallization region from a polycrystalline semiconductor region.

In accordance with the present invention, there is further provided a device of irradiation of a pulse laser beam having a linear shape and a rectangular shape beam spot onto a non-single crystal semiconductor thin film with scanning the pulse laser beam so that previous and next beam spots are partially overlapped, wherein the laser beam has a beam profile which includes: a first beam profile region having a first energy density which is lower than a micro-crystallization threshold value Ea of an amorphous semiconductor for forming a polycrystallization region; a second beam profile region having a second energy density which is not lower than the micro-crystallization threshold value Ea and is lower than a micro-crystallization threshold value Ep of a polycrystalline semiconductor for forming a first micro-polycrystallization region from an amorphous semiconductor region; and a third beam profile region having a third energy density which is not lower than the micro-crystallization threshold value Ep for forming a second micro-polycrystallization region from a polycrystalline semiconductor region.

The normal or conventional pulse laser beam has a beam profile which includes only the first beam profile region having the uniform energy density for forming a polycrystallization region.

However, in accordance with the present invention, the laser beam has a beam profile which includes three different regions, for example, the first, second and third regions for forming the polycrystallization region, the first micro-polycrystallization region and the second micro-polycrystallization region.

If the pulse laser to be irradiated onto the amorphous silicon thin film becomes beyond a critical energy density, then crystal grains of the polysilicon to be formed by the laser beam irradiation are very fine, for example, not larger than 20 nanometers. This critical energy density is so called as "micro-polycrystallization threshold value Ea from the amorphous silicon".

If the pulse laser to be irradiated onto the amorphous silicon thin film becomes beyond another critical energy density which is higher by 14% than the micro-polycrystallization threshold value Ea from the amorphous silicon, then not only the amorphous silicon but also the polycrystalline silicon show micro-polycrystallization. This critical energy density is so called as "micro-polycrystallization threshold value Ep from the polycrystalline silicon".

The first beam profile region of the pulse laser beam profile of the present invention has a first energy density which is lower than the micro-crystallization threshold value Ea from the amorphous semiconductor for forming a polycrystallization region from the non-single crystal semiconductor region. The meaning of the word "non-single crystal" includes "amorphous", "polycrystal" and micro-crystal caused by a laser anneal".

The second beam profile region of the pulse laser beam profile of the present invention has a second energy density which is not lower than the micro-crystallization threshold value Ea and is lower than the micro-crystallization threshold value Ep from the polycrystalline semiconductor for forming a first micro-polycrystallization region from the amorphous semiconductor region. No micro-polycrystallization appears on the polycrystalline semiconductor region.

The third beam profile region of the pulse laser beam profile of the present invention has a third energy density which is not lower than the micro-crystallization threshold value Ep for forming a second micro-polycrystallization region from the polycrystalline semiconductor region.

The micro-polycrystallization is caused upon changing a crystal core formation mechanism in re-crystallization, wherein a non-uniform core formation initiated from an interface between a substrate and a thin film as a core formation site is changed into This change in the crystal core formation mechanism depends upon a maximum temperature of the thin film by the anneal and a cooling rate. The micro-polycrystallization threshold value depends upon the thickness of the thin film, the film structure, a wavelength of the pulse laser and a pulse width.

A boundary between the laser beam irradiated region and the unirradiated region defined by the bean edge of the previously irradiated pulse laser beam is covered with the third beam profile region for the second micro-crystallization region of the next pulse laser beam to be irradiated the next time, so that the boundary between the laser beam irradiated region and the unirradiated region receives the third energy density which is not lower than the micro-crystallization threshold value Ep for forming a second micro-crystallization region from the polycrystalline semiconductor region, in order to obtain the required uniformity of the crystal structure of the thin film independently from a hysteresis of the pulse laser beam irradiations. Namely, the crystal structure of the boundary between the pulse laser irradiated and unirradiated regions is made free from the hysteresis of the pulse laser beam irradiations. This exactly solve the problem with use of the beam edge influence of the pulse laser beam irradiations. The micro-crystallized region then receives irradiation of a small energy density region of the pulse laser beam in order to form a highly uniform polycrystalline semiconductor thin film.

The second beam profile regions of the pulse laser beam of the present invention for forming a first micro-polycrystallization region from the amorphous semiconductor region are positioned adjacent to the third beam profile region of the pulse laser beam for forming a second micro-polycrystallization region from the polycrystalline semiconductor region, wherein the second beam profile regions sandwich the third beam profile region in front and back sides in the scanning direction, so that the thin film beam spot region is exposed to the second beam profile region and subsequently the third beam profile region, followed by the second beam profile region again.

It is preferable that a first energy density gradient of the boundary between the first irradiating second beam profile region and the third beam profile region is larger than a second energy density gradient of the boundary between the third beam profile region and the second irradiating second beam profile region, so that the degree of uniformity of the crystal grain size distribution is further improved.

The word "energy density gradient" means a gradient of sloped regions of the energy density profiles of the above novel pulse laser beam. One of the novel energy density profiles of the above novel pulse laser beam is, for example, illustrated in FIG. 3A. The novel energy density profile has two points having the micro-crystallization threshold value Ep at opposite ends of the third beam profile region for forming a second micro-polycrystallization region from the polycrystalline semiconductor region. The gradients of the energy density of those points are "energy density gradient" of those points. A pitch for scanning the pulse laser beam is not larger than a width of the third beam profile region. It is preferable that the pitch is not larger than a half of the width of the third beam profile region, so that the polycrystallized region formed by the previous pulse laser beam irradiation and positioned in front of the beam spot is micro-crystallized by the next pulse laser beam irradiation.

It is also possible that at least one of the first beam profile region for forming a polycrystallization region from the non-single crystal semiconductor region and the second beam profile region for forming a first micro-polycrystallization region from the amorphous semiconductor region, both of which are positioned in front of the third beam profile region in the scanning direction, would have a flat profile as illustrated in FIG. 6A. In this case, it is further preferable that the second beam profile region for forming a first micro-polycrystallization region from the amorphous semiconductor region has the flat profile in order to allow the flat profile energy density to be increased as many as possible to enlarge the crystal grain size. The energy density of the flat profile region is decided in consideration of the desired crystal grain size. When the above energy density profile is selected, the scanning pitch is preferably not larger than the width of the flat profile region and more preferably not larger than a half of the flat profile region, so that the uniformity of the crystal grain size or diameter is further improved.

In accordance with the present invention, there is furthermore provided a method of double pulse irradiations of first and second pulse laser beams having been emitted from difference sources in sequence onto the same point of a non-single crystal semiconductor thin film with a linear shape and a rectangular shape beam spot, by scanning the first and second pulse laser beams so that first and second beam spots are partially overlapped along a width direction perpendicular to a scanning direction, wherein the first laser beam has a first beam profile which includes: at least a third beam profile region having a third energy density which is not lower than the micro-crystallization threshold value Ep for forming a second micro-polycrystallization region from a polycrystalline semiconductor region, whilst the second laser beam has a second beam profile which includes: a first beam profile region having a first energy density which is lower than a micro-crystallization threshold value Ea of an amorphous semiconductor for forming a polycrystallization region; and a second beam profile region having a second energy density which is not lower than the micro-crystallization threshold value Ea and is lower than a micro-crystallization threshold value Ep of a polycrystalline semiconductor for forming a first micro-polycrystallization region from a amorphous semiconductor region.

In accordance with the present invention, there is moreover provided a device for double pulse irradiations of first and second pulse laser beams having been emitted from difference sources in sequence onto the same point of a non-single crystal semiconductor thin film with a linear shape and a rectangular shape beam spot, by scanning the first and second pulse laser beams so that first and second beam spots are partially overlapped along a width direction perpendicular to a scanning direction, wherein the first laser beam has a first beam profile which includes: at least a third beam profile region having a third energy density which is not lower than the micro-crystallization threshold value Ep for forming a second micro-polycrystallization region from a polycrystalline semiconductor region, whilst the second laser beam has a second beam profile which includes: a first beam profile region having a first energy density which is lower than a micro-crystallization threshold value Ea of an amorphous semiconductor for forming a polycrystallization region; and a second beam profile region having a second energy density which is not lower than the micro-crystallization threshold value Ea and is lower than a micro-crystallization threshold value Ep of a polycrystalline semiconductor for forming a first micro-polycrystallization region from an amorphous semiconductor region.

The normal or conventional pulse laser beam has a beam profile which includes only the first beam profile region having the uniform energy density for forming a polycrystallization region.

However, in accordance with the present invention, the first and second laser beams have beam profiles which include three different regions, for example, the first, second and third profile regions for forming the polycrystallization region, the first micro-polycrystallization region and the second micro-polycrystallization region. Namely, the first pulse laser beam has the third profile region whilst the second pulse laser beam has the first and second profile regions.

The first beam profile region of the second pulse laser beam of the present invention has a first energy density which is lower than the micro-crystallization threshold value Ea from the amorphous semiconductor for forming a polycrystallization region from the non-single crystal semiconductor region. The meaning of the word "non-single crystal" includes "amorphous", "polycrystal" and micro-crystal caused by a laser anneal".

The second beam profile region of the second pulse laser beam of the present invention has a second energy density which is not lower than the micro-crystallization threshold value Ea and is lower than the micro-crystallization threshold value Ep from the polycrystalline semiconductor for forming a first micro-polycrystallization region from the amorphous semiconductor region. No micro-polycrystallization appears on the polycrystalline semiconductor region.

The third beam profile region of the first pulse laser beam of the present invention has a third energy density which is not lower than the micro-crystallization threshold value Ep for forming a second micro-polycrystallization region from the polycrystalline semiconductor region.

A boundary between the laser beam irradiated region and the unirradiated region defined by the bean edge of the previously irradiated pulse laser beam is covered with the third beam profile region for the second micro-crystallization region of the next pulse laser beam to be irradiated the next time, so that the boundary between the laser beam irradiated region and the unirradiated region receives the third energy density which is not lower than the micro-crystallization threshold value Ep for forming a second micro-crystallization region from the polycrystalline semiconductor region, in order to obtain the required uniformity of the crystal structure of the thin film independently from a hysteresis of the pulse laser beam irradiations. Namely, the crystal structure of the boundary between the pulse laser irradiated and unirradiated regions is made free from the hysteresis of the pulse laser beam irradiations. This exactly solve the problem with use of the beam edge influence of the pulse laser beam irradiations. The micro-crystallized region then receives irradiation of a small energy density region of the pulse laser beam in order to form a highly uniform polycrystalline semiconductor thin film.

Figures 8A, 8B, 8C, 8D:
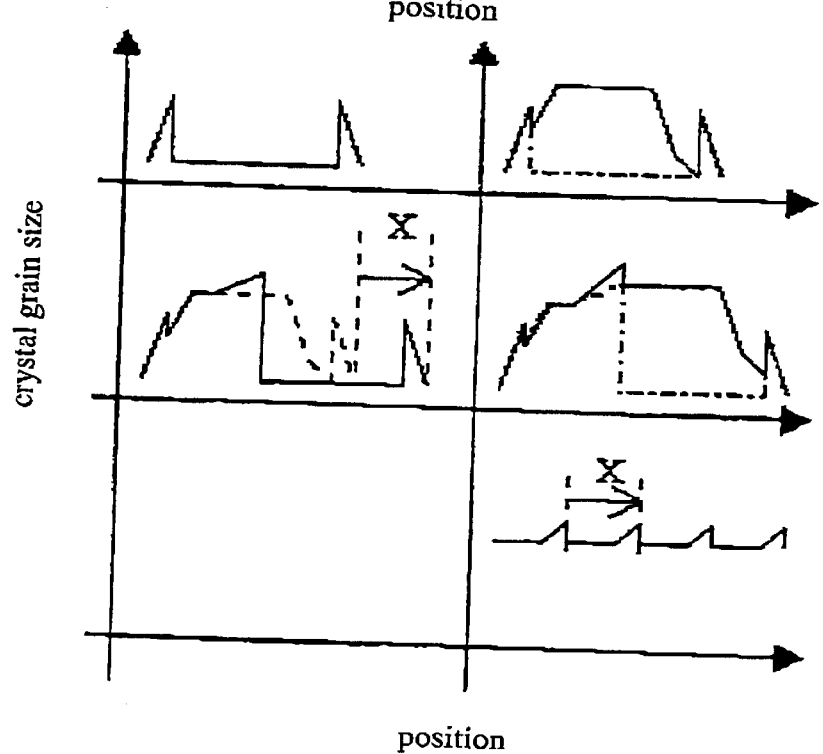
FIG. 8A is a diagram illustrative of a variation in energy density over position of a novel pulse laser beam with a top non-flat energy density profile to be irradiated onto an amorphous silicon thin film for annealing the same in a third embodiment in accordance with the present invention.
FIG. 8B is a diagram illustrative of a distribution in crystal grain size over position of a polycrystalline region formed by irradiation of a pulse laser beam with the energy density profile of FIG. 8A onto the amorphous silicon thin film in a third embodiment in accordance with the present invention.
FIG. 8C is a diagram illustrative of a change of distribution in crystal grain size over position of the polycrystalline region by a single time movement of the pulse laser beam at a pitch "x" the pulse laser beam, wherein the crystal grain size has a minimum size value in the vicinity of the laser beam of FIG. 8B in a third embodiment in accordance with the present invention.
FIG. 8D is a diagram illustrative of a final distribution in crystal grain size over position of the polycrystalline region after scanned at a pitch "x" the pulse laser beam, wherein the crystal grain size varied over position in a third embodiment in accordance with the present invention.

It is also possible that at least one of the first beam profile region for forming a polycrystallization region from the non-single crystal semiconductor region and the second beam profile region for forming a first micro-polycrystallization region from the amorphous semiconductor region, both of which are included in the second pulse laser beam, would have a flat profile as illustrated in FIG. 8A. In this case, it is further preferable that the second beam profile region for forming a first micro-polycrystallization region from the amorphous semiconductor region has the flat profile in order to allow the flat profile energy density to be increased as many as possible to enlarge the crystal grain size. The energy density of the flat profile region is decided in consideration of the desired crystal grain size. When the above energy density profile is selected, the scanning pitch is preferably not larger than the width of the flat profile region and more preferably not larger than a half of the flat profile region, so that the uniformity of the crystal grain size or diameter is further improved.

The above present invention is further described more concretely with reference to the drawings by taking tree typical embodiments.

FIG. 3A is illustrative of a profile in a width direction perpendicular to a liner direction of a linear shaped pulse laser beam with a top non-flat energy density profile to be irradiated onto an amorphous silicon thin film for annealing the same, wherein a scanning direction is a direction from light to right. The maximum energy density is above the micro-crystallization threshold value Ep from the polycrystalline semiconductor. The third beam profile region having the third energy density not lower than Ep for forming a second micro-polycrystallization region from the polycrystalline semiconductor region has a center position. The second beam profile regions having the second energy density not lower than Ea and lower than Ep for forming a first micro-polycrystallization region from the amorphous semiconductor region are positioned adjacent to the third beam profile region. Namely the second beam profile regions are positioned in opposite sides, for example, front and rear sides of the third beam profile region. Further, the first beam profile regions having the first energy density lower than Ea for forming a polycrystallization region from the non-single crystal semiconductor region are positioned adjacent to the second beam profile region. Namely the first beam profile regions are positioned in opposite sides, for example, front and rear sides of the second beam profile regions. The maximum energy density portion of the profile is positioned in a front side of a bean center in the scanning direction or in a right side of the beam center. The center position of the third beam profile region not lower than the micro-crystallization threshold value Ep for forming the second micro-polycrystallization region from the polycrystalline semiconductor region is positioned in a front side of a bean center in the scanning direction or in a right side of the beam center. The novel energy density profile has two points having the micro-crystallization threshold value Ep at opposite ends of the third beam profile region. The gradients of the energy density of those points are different, for example, the right side or the front side point having Ep has a larger gradient than that of the left side or the rear side point having Ep. The right side or the front side boundary between the third beam profile region and the second beam profile region has a larger gradient than that of the left side or the rear side boundary between the third beam profile region and the second beam profile region. The above beam profile is asymmetrical.

This asymmetrical pulse laser beam profile can be obtained as follows. FIG. 5 is illustrative of a novel device including a pulse laser beam source 607 for irradiation of the above pulse laser beam with the above novel beam profile. FIGS. 4A through 4D are illustrative of different and available methods of making the above novel pulse laser beam energy density profile.

Figure 4A:
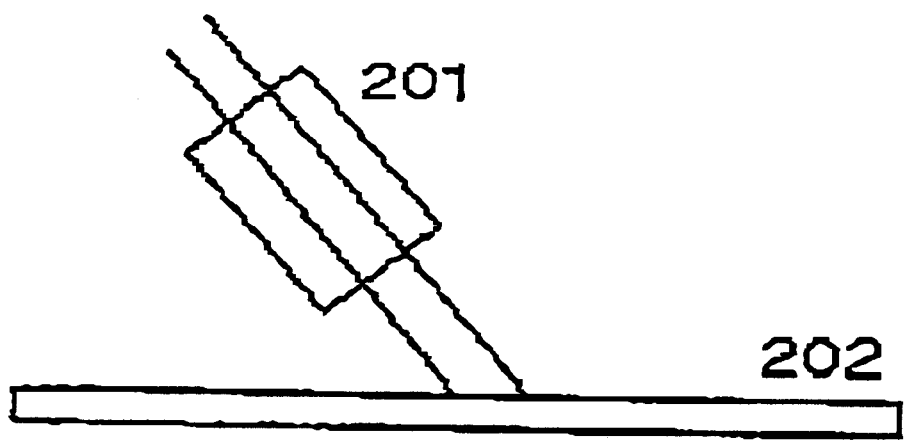
FIG. 4A is a schematic view illustrative of a method of making a novel pulse laser beam energy density profile by an oblique angle incidence of a symmetrical pulse laser beam in a first embodiment in accordance with the present invention.
Figure 5:
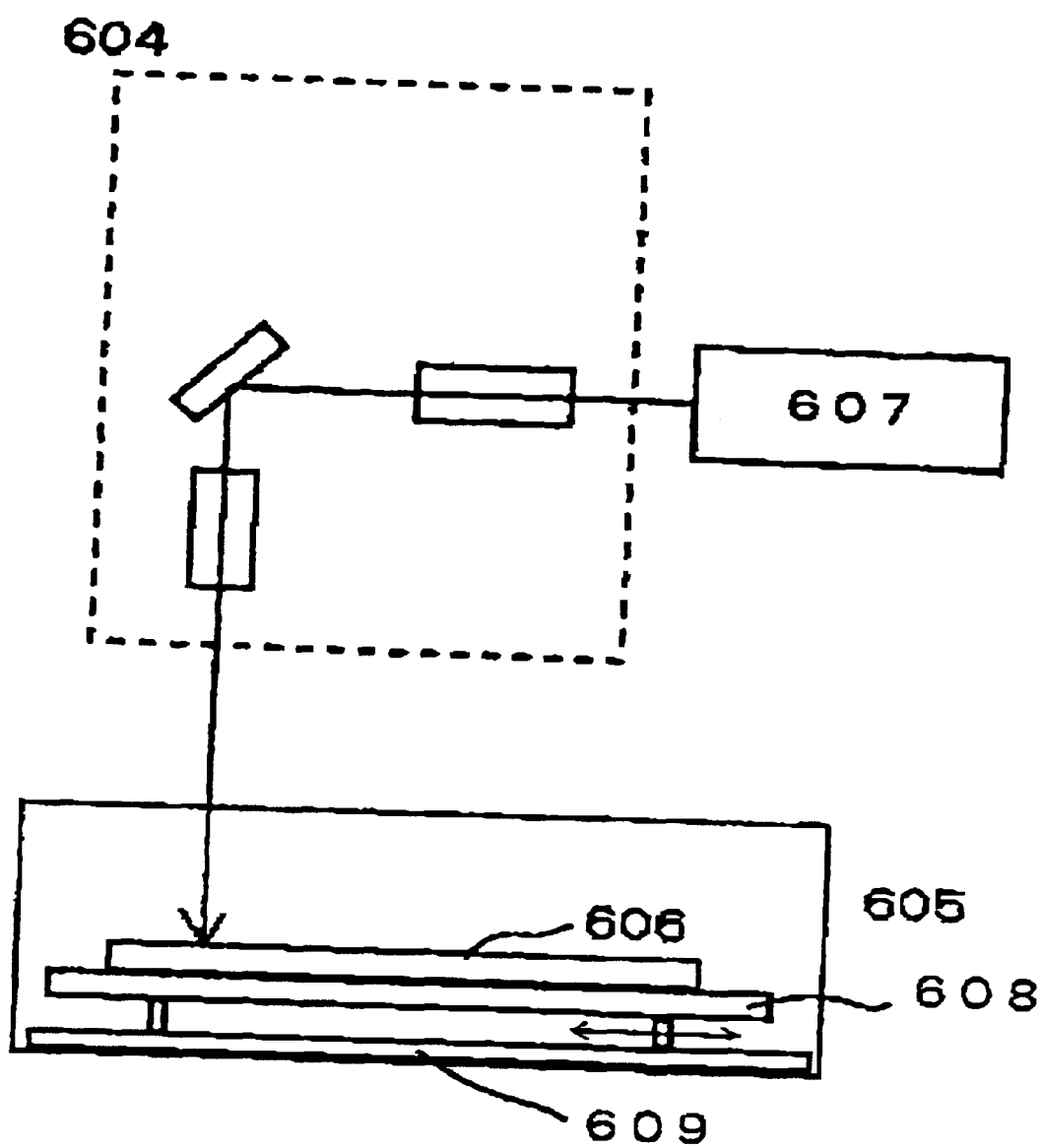
FIG. 5 is a schematic view illustrative of a novel device for irradiation of a pulse laser beam with a novel beam profile in a first embodiment in accordance with the present invention.

FIG. 4A is illustrative of a method of making a novel pulse laser beam energy density profile by an oblique angle incidence of a symmetrical pulse laser beam 201. If the pulse laser bean 201 is irradiated onto the thin film 202 before the pulse laser beam 201 is focused at a final stage lens focus point, the incident direction is the left side so that the maximum energy density point is positioned right side or the front side in scanning direction of the beam center, whereby the center of the third beam profile region is positioned right side or the front side in scanning direction of the beam center. If, however, the pulse laser beam is irradiated onto the thin film after the pulse laser beam is focused at a final stage lens focus point, the incident direction is the right side so that the maximum energy density point is positioned right side or the front side in scanning direction of the beam center, whereby the center of the third beam profile region is positioned right side or the front side in scanning direction of the beam center.

Figure 4B:
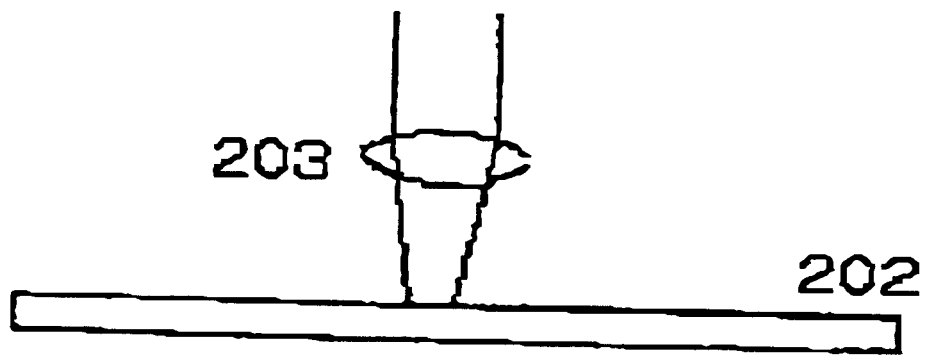
FIG. 4B is a schematic view illustrative of another method of making a novel pulse laser beam energy density profile by a vertical angle incidence of an asymmetrical pulse laser beam transmitted through an optical lens asymmetrical in convergence in a first embodiment in accordance with the present invention.

FIG. 4B is illustrative of another method of making a novel pulse laser beam energy density profile by a vertical angle incidence of an asymmetrical pulse laser beam transmitted through an optical lens 203 asymmetrical in convergence or refraction, so that the maximum energy density point is positioned right side or the front side in scanning direction of the beam center, whereby the center of the third beam profile region is positioned right side or the front side in scanning direction of the beam center.

Figure 4C:
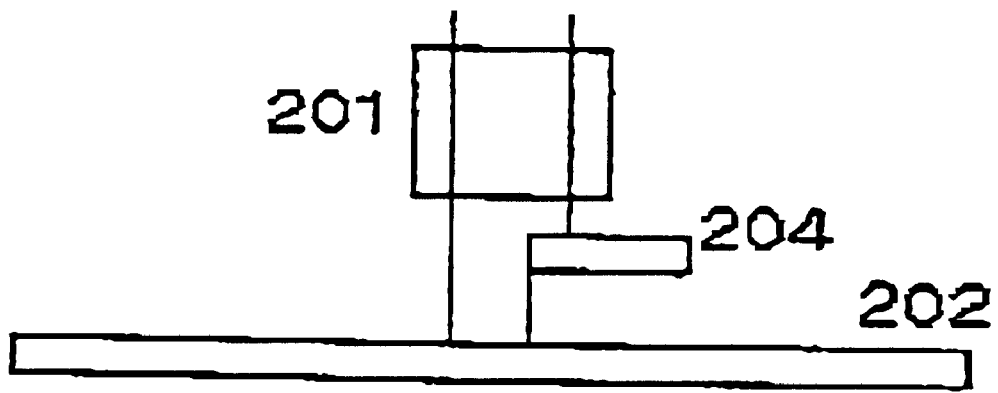
FIG. 4C is a schematic view illustrative of still another method of making a novel pulse laser beam energy density profile by a vertical angle incidence of a partially cut off pulse laser beam transmitted partially cut off by a shielding mask in a first embodiment in accordance with the present invention.

FIG. 4C is illustrative of still another method of making a novel pulse laser beam energy density profile by a vertical angle incidence of a partially cut off pulse laser beam 201 partially cut off by a shielding mask 204 make of a metal such as chromium, aluminum, and stainless alloys so as to obtain an abruptness of the pulse laser beam energy density profile in the front side in the scanning direction, so that the maximum energy density point is positioned right side or the front side in scanning direction of the beam center, whereby the center of the third beam profile region is positioned right side or the front side in scanning direction of the beam center.

Figure 4D:
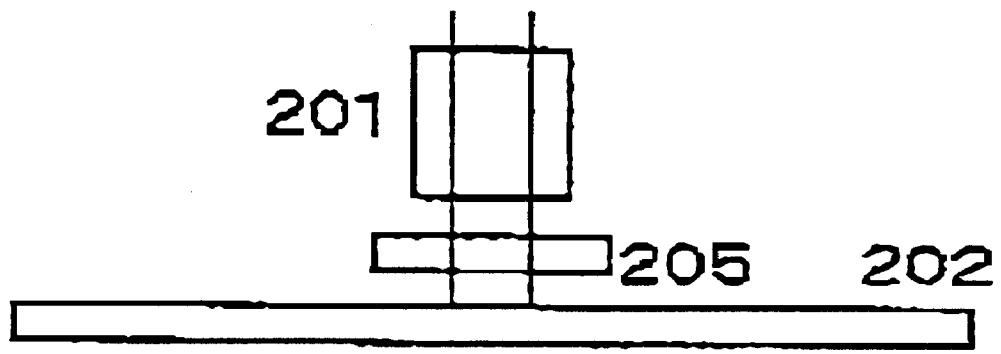
FIG. 4D is a schematic view illustrative of yet another method of making a novel pulse laser beam energy density profile by a vertical angle incidence of a modified pulse laser beam transmitted through a dielectric thin film or a hologram device in a first embodiment in accordance with the present invention.

FIG. 4D is illustrative of yet another method of making a novel pulse laser beam energy density profile by a vertical angle incidence of a modified pulse laser beam 201 transmitted through a dielectric thin film 205 or a hologram device. The dielectric thin film has an asymmetrical lamination structure to obtain an asymmetrical refraction index profile, so that the maximum energy density point is positioned right side or the front side in scanning direction of the beam center, whereby the center of the third beam profile region is positioned right side or the front side in scanning direction of the beam center. The hologram device utilizes the hologram effects to divide the pulse laser beam into plural parts to be irradiated onto the thin film, so that the maximum energy density point is positioned right side or the front side in scanning direction of the beam center, whereby the center of the third beam profile region is positioned right side or the front side in scanning direction of the beam center.

The sequential changes in crystal structure of the thin film upon the pulse laser beam having the above energy density profile as illustrated in FIG. 3A in the scanning direction will subsequently by described with reference to FIGS. 3B through 3D.

FIG. 3B is illustrative of a distribution in crystal grain size over position of a polycrystalline region formed by a single irradiation of the pulse laser beam with the energy density profile of FIG. 3A onto the amorphous silicon think film. With increase in the energy density of the pulse laser beam, the crystal grain size is enlarged. The micro-crystallization is caused on a region where the energy density of the pulse laser beam is above the micro-crystallization threshold value Ea from the amorphous semiconductor. A difference in gradient of the energy density profile of opposite edges, for example, the front and rear edges of the pulse laser beam. The front or right side edge of the pulse laser beam has a larger gradient of the energy density profile than that of the rear and left side edge of the pulse laser beam, for which reason a variation of the crystal grain size or diameter in the front and right edges of the pulse laser beam is larger than the variation of the crystal grain size or diameter in the rear and left edges of the pulse laser beam.

FIG. 3C is illustrative of a change of distribution in crystal grain size over position of the polycrystalline region by a single time movement of the pulse laser beam at a pitch "x" the pulse laser beam, wherein the crystal grain size has a minimum size value in the vicinity of the laser beam of FIG. 3B. The beam spot right edge portion having large size crystal grains as formed by the beam right edge of FIG. 3B is not irradiated with the energy density larger than Ep, whereby the micro-crystallization is caused and the crystal grain size uniformity is improved. If the pitch "x" is larger than the width of the third beam profile region having the third energy density not lower than Ep, then the above beam spot right edge portion having large size crystal grains as formed by the beam right edge of FIG. 3B will remain, whereby no complete crystal grain size uniformity is obtained. On the other hand, the left region is irradiated with the beam having the energy density of less than Ep and having the relatively gentle energy density gradient profile, whereby a large crystal grain formation appears on the left region which indicates a gradual crystal grain size change.

FIG. 3D is illustrative of a final distribution in crystal grain size over position of the polycrystalline region after scanned at a pitch "x" the pulse laser beam, wherein the crystal grain size varied over position. The beam right edge region having the large size crystal grains will obtain an improved crystal grain size uniformity upon the next laser beam irradiation, wherein the change in the crystal grain size depends upon only the left portion or rear portion of the laser beam profile.

A second embodiment of the present invention will be described. FIG. 6A is illustrative of a variation in energy density over position of a novel pulse laser beam with a top non-flat energy density profile to be irradiated onto an amorphous silicon thin film for annealing the same. The laser beam energy density profile comprises the front and right profile region having a varied energy density of not less than Ep and the rear and left profile region having a constant energy density of less than Ep.

Figure 7A:
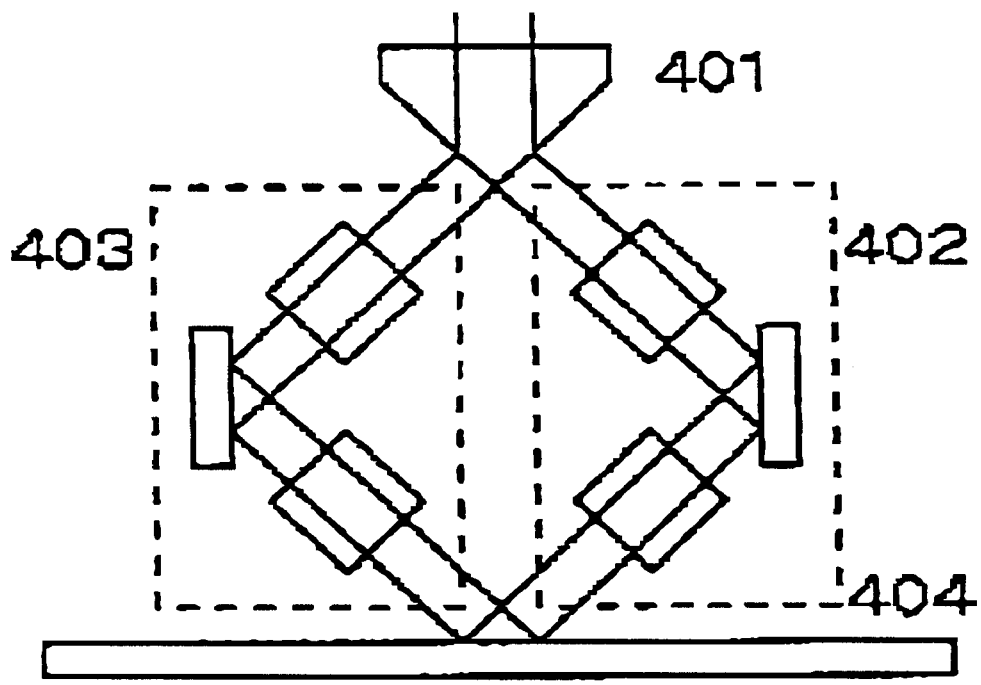
FIG. 7A is a schematic view illustrative of a method of making a novel pulse laser beam energy density profile by using a beam splitter and optical systems.

FIG. 7A is a schematic view illustrative of a method of making a novel pulse laser beam energy density profile by using a beam splitter and optical systems. The pulse laser beam is divided by a beam splitter 401 into two divided beams which are transmitted through optical systems 402 and 403 respectively onto the same point of the thin film 404. The irradiation of the front and right beam portion having the third beam profile not lower than Ep forms a second micro-polycrystallization region from the polycrystalline semiconductor region. This front and right beam portion is free of limitation of profile shape. The rear and left beam portion having the constant energy density is limited by the optical system 403 to suppress the energy density level error within 5%.

Figure 7B:
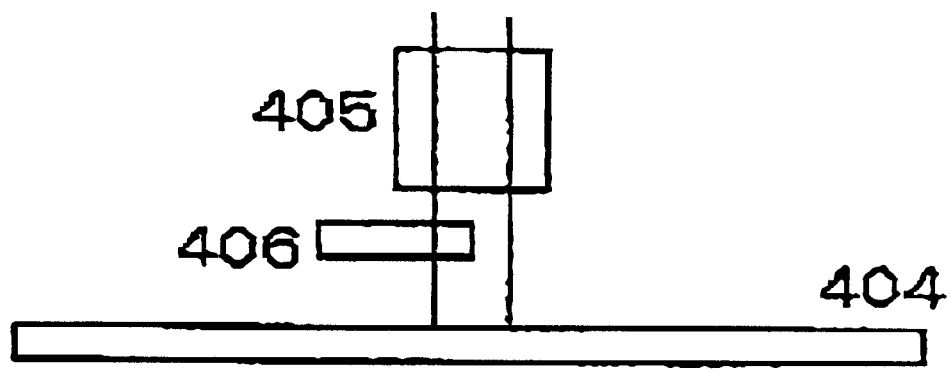
FIG. 7B is a schematic view illustrative of another method of making a novel pulse laser beam energy density profile by using an attenuator as a final stage lens, so that a part of the laser beam is transmitted through the attenuator.

FIG. 7B is a schematic view illustrative of another method of making a novel pulse laser beam energy density profile by using an attenuator 406 as a final stage lens, so that a part of the laser beam 405 is transmitted through the attenuator 406. After the top flat profile has been formed, the left portion of the beam is transmitted through the attenuator 406 to change the energy density of the left portion. The attenuator 406 many comprise a coated quartz plate.

Figure 7C:
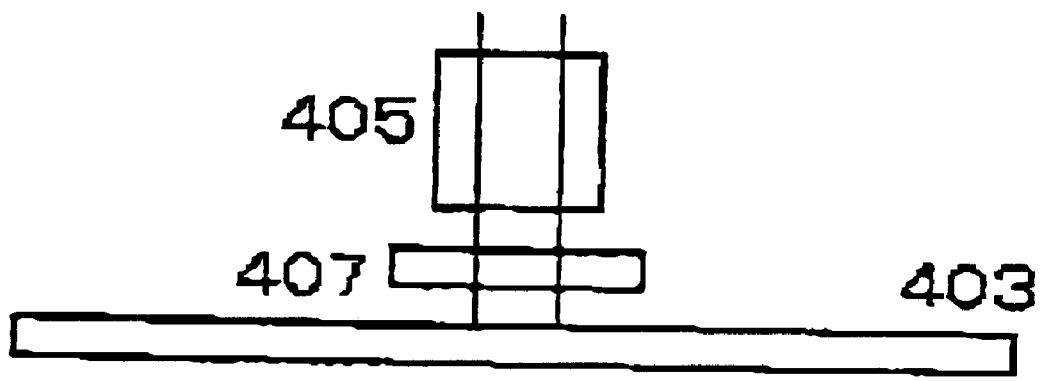
FIG. 7C is a schematic view illustrative of still another method of making a novel pulse laser beam energy density profile by using a dielectric thin film or a hologram device to obtain the desired energy density profile.

FIG. 7C is a schematic view illustrative of still another method of making a novel pulse laser beam energy density profile by using a dielectric thin film 407 or a hologram device to obtain the desired energy density profile.

The sequential changes in crystal structure of the thin film upon the pulse laser beam having the above energy density profile as illustrated in FIG. 6A in the scanning direction will subsequently by described with reference to FIGS. 6B through 6D.

FIG. 6B is illustrative of a distribution in crystal grain size over position of a polycrystalline region formed by irradiation of a pulse laser beam with the energy density profile of FIG. 6A onto the amorphous silicon thin film. With increase in the energy density of the pulse laser beam, the crystal grain size is enlarged. The micro-crystallization is caused on a region where the energy density of the pulse laser beam is above the micro-crystallization threshold value Ea from the amorphous semiconductor. The top flat energy density profile rear and left region has the constant energy density level of not less than Ea and less than Ep.

FIG. 6C is illustrative of a change of distribution in crystal grain size over position of the polycrystalline region by a single time movement of the pulse laser beam at a pitch "x" the pulse laser beam, wherein the crystal grain size has a minimum size value in the vicinity of the laser beam of FIG. 6B. The beam spot right edge portion having large size crystal grains as formed by the beam right edge of FIG. 3B is now irradiated with the energy density larger than Ep, whereby the micro-crystallization is caused and the crystal grain size uniformity is improved. If the pitch "x" is larger than the width of the third beam profile region having the third energy density not lower than Ep, then the above beam spot right edge portion having large size crystal grains as formed by the beam right edge of FIG. 3B will remain, whereby no complete crystal grain size uniformity is obtained. On the other hand, the left region is irradiated with the beam having the energy density of less than Ep and having the relatively gentle energy density gradient profile, whereby a large crystal grain formation appears on the left region which indicates a gradual crystal grain size change.

FIG. 6D is illustrative of a final distribution in crystal grain size over position of the polycrystalline region after scanned at a pitch "x" the pulse laser beam, wherein the crystal grain size varied over position. The beam right edge region having the large size crystal grains will obtain an improved crystal grain size uniformity upon the next laser beam irradiation, wherein the change in the crystal grain size depends upon only the left portion or rear portion of the laser beam profile.

A third embodiment of the present invention will be described. FIG. 8A is illustrative of energy density profiles of first and second pulse laser beams with top flat and non-flat energy density profiles to be irradiated onto an amorphous silicon thin film for annealing the same. Double pulse irradiations of the first and second pulse laser beams are emitted from difference sources in sequence onto the same point of the thin film, by scanning the first and second pulse laser beams so that first and second beam spots are partially overlapped along a width direction perpendicular to a scanning direction, wherein the first laser beam has a first beam profile which includes: at least a third beam profile region having a third energy density which is not lower than the micro-crystallization threshold value Ep for forming a second micro-polycrystallization region from a polycrystalline semiconductor region, whilst the second laser beam has a second beam profile which includes a top flat beam profile region having a second energy density level which is not lower than the micro-crystallization threshold value Ea and is lower than a micro-crystallization threshold value Ep of a polycrystalline semiconductor for forming a first micro-polycrystallization region from an amorphous semiconductor region. This first laser beam is free of limitation of profile shape. The second laser beam having the constant energy density is limited to suppress the energy density level error within 5%.

The sequential changes in crystal structure of the thin film upon the pulse laser beam having the above energy density profile as illustrated in FIG. 8A in the scanning direction will subsequently by described with reference to FIGS. 8B through 8D.

FIG. 8B is illustrative of a distribution in crystal grain size over position of a polycrystalline region formed by irradiation of a pulse laser beam with the energy density profile of FIG. 8A onto the amorphous silicon thin film. With increase in the energy density of the first pulse laser beam, the crystal grain size is enlarged. The micro-crystallization is caused on a region where the energy density of the pulse laser beam is above the micro-crystallization threshold value Ea from the amorphous semiconductor. Subsequently, the second pulse laser beam is irradiated which has the constant energy density level of not less than Ea and less than Ep, whereby the large size crystal grains depending upon the constant energy density level are formed. It is unnecessary that the width of the top flat of the second pulse laser beam is wider than the third beam profile region of the first pulse laser beam. Sine it is necessary to irradiate the next first pulse laser beam after the thin film has been melted by the second pulse laser beam and then solidified, a time interval between the first and second pulse laser beams in a single set pulse cycle is preferably within a half of the time interval of the previous and next emissions of the first pulse laser beams.

FIG. 8C is illustrative of a change of distribution in crystal grain size over position of the polycrystalline region by a single time movement of the first and second pulse laser beams at a pitch "x" the pulse laser beam, wherein the crystal grain size has a minimum size value in the vicinity of the laser beam of FIG. 8B. The beam spot right edge portion having large size crystal grains as formed by the beam right edge of FIG. 8B is now irradiated with the energy density larger than Ep, whereby the micro-crystallization is caused and the crystal grain size uniformity is improved. If the pitch "x" is larger than the width of the third beam profile region having the third energy density not lower than Ep, then the above beam spot right edge portion having large size crystal grains as formed by the beam right edge of FIG. 8B will remain, whereby no complete crystal grain size uniformity is obtained. On the other hand, the second pulse laser beam is irradiated, whereby a large crystal grain formation appears by the second pulse laser beam on the left region which indicates a gradual crystal grain size change.

FIG. 8D is illustrative of a final distribution in crystal grain size over position of the polycrystalline region after scanned at a pitch "x" the first and second pulse laser beam, wherein the crystal grain size varied over position. The beam right edge region having the large size crystal grains formed by the irradiations of the first and second pulse laser beams will obtain an improved crystal grain size uniformity upon the next first laser beam irradiation, wherein the change in the crystal grain size depends upon only the second laser beam profile having the top flat or constant energy density profile.

Figure 9:
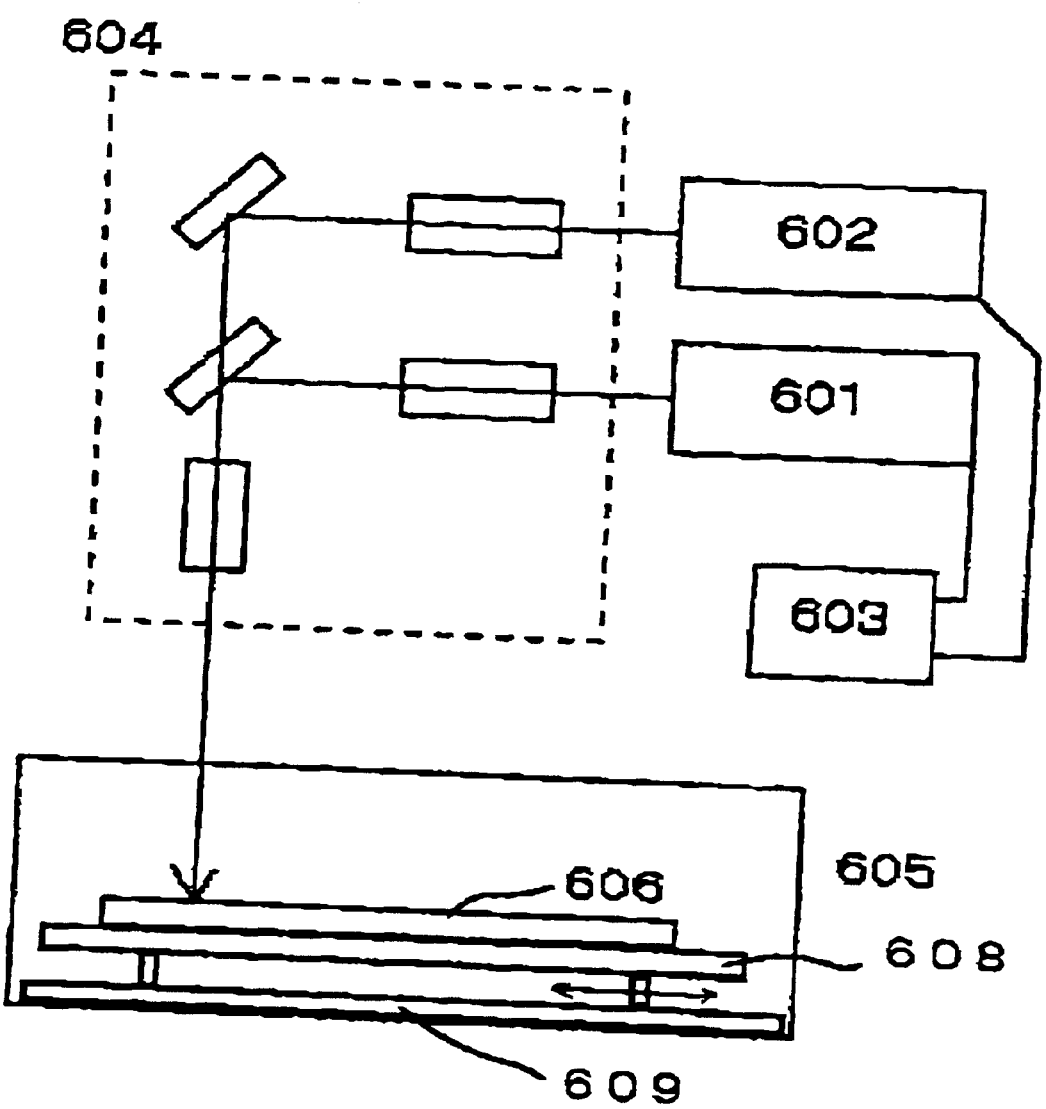
FIG. 9 is a schematic view illustrative of a novel device for irradiation of a pulse laser beam with a novel beam profile in a third embodiment in accordance with the present invention.

FIG. 9 is illustrative of a novel device for the above double irradiation pulse laser beams with the above novel beam profiles. The first and second pulse laser beam sources 601 and 602 are controlled by a synchronizing controller 603 to emit the first and second pulse laser beams. The first and second pulse laser beams are transmitted through an optical system 604 and then irradiated onto the thin film 605.

A first example of the above first embodiment in accordance with the present invention will be described.

A glass substrate 609, e.g., OA-2 commercially available from Nippon Electric Glass Co. A silicon dioxide base layer 608 having a thickness of 100 nanometers is deposited on the substrate by a plasma enhanced chemical vapor deposition method using $SiH_4$ and $N_2O$.

An amorphous silicon thin film 606 having a thickness of 75 nanometers is deposited on the silicon dioxide base layer by a low pressure chemical vapor deposition method using $Si_2H_6$ under deposition conditions of a flow rate of 150 sccm of $Si_2H_6$, a pressure of 8 Pa and a substrate temperature of 45° C. for 70 minutes.

Figure 10:
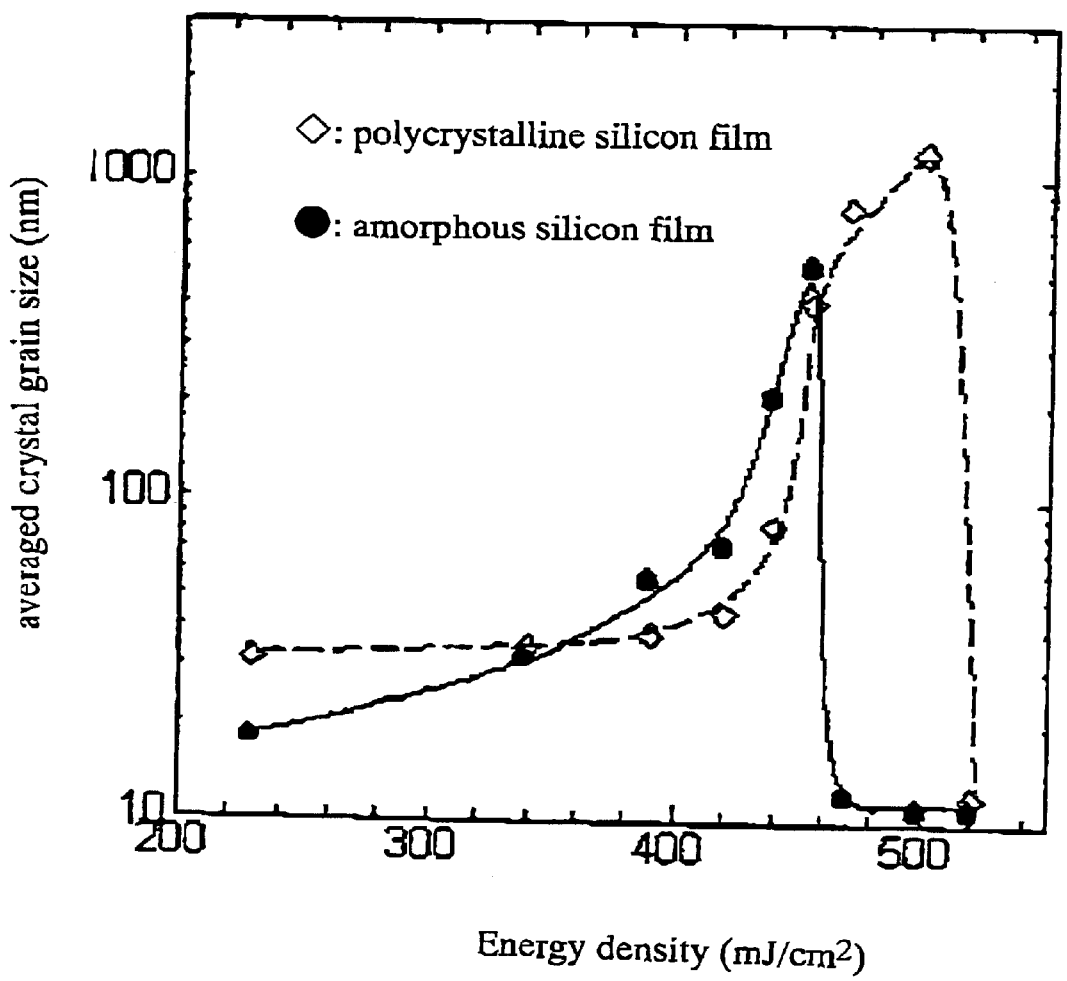
FIG. 10 is a diagram illustrative of variations in averaged crystal grain sizes or diameters of a polycrystalline silicon thin film and an amorphous silicon thin film over pulse laser beam energy density.

As a provisional examination to decide the optimum energy density, Ep is measured by irradiation of a pulse laser beam with a pulse width of 50 nanometers and a wavelength of 308 nanometers onto the amorphous silicon thin film. FIG. 10 is illustrative of variations in averaged crystal grain sizes or diameters of a polycrystalline silicon thin film and an amorphous silicon thin film over pulse laser beam energy density upon a single time pulse laser beam irradiation onto both thin films, wherein the polycrystalline silicon thin film and the amorphous silicon thin film have a thickness of 75 nanometers, and the polycrystalline silicon thin film has an averaged crystal grain size of 18 nanometers. Ea of the amorphous silicon thin film is 460 mJ/cm$^2$. The amorphous silicon thin film is irradiated with the laser beam of 340 mJ/cm$^2$ to form the polycrystalline silicon thin film has the averaged crystal grain size of 18 nanometers. Ep of the polycrystalline silicon thin film is 520 mJ/cm$^2$.

The beam energy density profile is decided as follows. A maximum energy density is 550 mJ/cm$^2$. The third beam profile region having the energy density level of not less than Ep has a width of 0.1 millimeter. A front or right side Ep point of the profile has an energy density gradient of 520 J/cm$^3$. A rear or left side Ep point of the profile has an energy density gradient of 10 J/cm$^3$. The pulse laser beam is irradiated at a pitch of 5 micrometers. A large and uniform crystal rain size distribution of about 830–1120 nanometers as illustrated in FIG. 3D can be obtained.

Figure 1D:
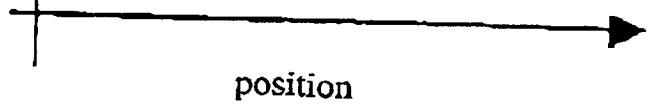
FIG. 1D is a diagram illustrative of a final distribution in crystal grain size over position of the polycrystalline region after scanned at a pitch "x" the pulse laser beam, wherein the crystal grain size varied over position.

As a comparative example, the top flat energy density profile pulse laser beam is irradiated, wherein the energy density of the top flat portion is 420 mJ/cm$^2$, and the width of the top flat portion is 0.3 millimeters, the beam edge width of 10 micrometers and the pitch is 15 micrometers. A small and non-uniform crystal rain size distribution of about 30–200 nanometers as illustrated in FIG. 1D can be obtained.

As a further comparative example, the top flat energy density profile pulse laser beam is irradiated, wherein the energy density of the top flat portion is 530 mJ/cm$^2$, and the width of the top flat portion is 0.3 millimeters, the beam edge width of 10 micrometers and the pitch is 15 micrometers. An extremely variable crystal rain size distribution of about 20–1260 nanometers as illustrated in FIG. 2D can be obtained.

A second example of the above second embodiment in accordance with the present invention will be described.

A glass substrate OA-2 commercially available from Nippon Electric Glass Co. A silicon dioxide base layer having a thickness of 100 nanometers is deposited on the substrate by a plasma enhanced chemical vapor deposition method using $SiH_4$ and $N_2O$.

An amorphous silicon thin film having a thickness of 50 nanometers id deposited on the silicon dioxide base layer by a low pressure chemical vapor deposition method using $Si_2H_6$ under deposition conditions of a flow rate of 150 sccm of $Si_2H_6$, a pressure of 8 Pa and a substrate temperature of 45° C. for 46 minutes.

The polycrystalline silicon thin film and the amorphous silicon thin film have a thickness of 50 nanometers. Ea of the amorphous silicon thin film is 420 mJ/cm$^2$. The amorphous silicon thin film is irradiated with the pulse laser beam having the pulse width of 50 nanometers and the wavelength of 308 nanometers to form the polycrystalline silicon thin film having Ep of 470 mJ/cm$^2$.

The beam energy density profile is decided as follows. A maximum energy density is 485 mJ/cm$^2$. The third beam profile region having the energy density level of not less than Ep has a width of 0.07 millimeters. An energy density of the flat portion is 450 mJ/cm$^2$. The width of the flat portion is 0.1 millimeter. The pulse laser beam is irradiated at a pitch of 10 micrometers. A large and uniform crystal rain size distribution of about 480–630 nanometers as illustrated in FIG. 3D can be obtained.

A third example of the above second embodiment in accordance with the present invention will be described.

A glass substrate 1737 commercially available from Corning Co. A silicon dioxide base layer having a thickness of 100 nanometers is deposited on the substrate by a plasma enhanced chemical vapor deposition method using $SiH_4$ and $N_2O$.

An amorphous silicon thin film having a thickness of 75 nanometers id deposited on the silicon dioxide base layer by a low pressure chemical vapor deposition method using $Si_2H_6$ under deposition conditions of a flow rate 150 sccm of $Si_2H_6$, a flow rate 400 sccm of $H_2$, a pressure of 100 Pa, a discharge power of 0.1 W/cm$^2$ and a substrate temperature of 320° C. for 8 minutes. Thereafter, a dehydrogenating anneal is carried out at a temperature of 400° C. and for two hours. Ea of the amorphous silicon thin film is 480 mJ/cm$^2$. The amorphous silicon thin film is irradiated with the pulse laser beam having the pulse width of 35 nanometers and the wavelength of 248 nanometers to form the polycrystalline silicon thin film having Ep of 480 mJ/cm$^2$.

The beam energy density profile of the first and second pulse laser beams are decided as follows. A maximum energy density of the first pulse laser beam is 570 mJ/cm$^2$. The third beam profile region having the energy density level of not less than Ep of the first pulse laser beam has a width of 0.3 millimeters. The first pulse laser beam is irradiated at 300 Hz. A top flat energy density of the second pulse laser beam is 480 mJ/cm$^2$. The top flat profile region has a width of 0.2 millimeters. The beam edge with of the second pulse laser beam is 10 micrometers. The second pulse laser beam is irradiated at 300 Hz. A time interval of the first and second pulse laser beams is 200 nanoseconds and a pitch of scanning of those beams is 20 micrometers. A large and uniform crystal rain size distribution of about 450–590 nanometers as illustrated in FIG. 8D can be obtained.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of irradiating a pulse laser beam onto a non-single crystal semiconductor thin film, comprising the steps of:

irradiating the semiconductor thin film with a pulse laser beam comprising a first, second, and third beam profile regions, said first beam profile region having a first energy density that is lower than a micro-crystallization threshold value Ea of an amorphous semiconductor, said first beam profile region forming a polycrystallization region, said second beam profile region having a second energy density which is greater than or equal to the micro-crystallization threshold value Ea and is lower than a micro-crystallization threshold value Ep of a polycrystalline semiconductor, said second beam profile region forming a first micro-polycrystallization region from an amorphous semiconductor region; and said third beam profile region having a third energy density which is greater than or equal to the micro-crystallization threshold value Ep, said third beam profile region forming a second micro-polycrystallization region from a polycrystalline semiconductor region; and scanning said pulse laser beam so that a first beam spot and a second beam spot partially overlap.

2. The method as claimed in claim 1, further comprising centering the third beam profile region in a scanning direction of a center of the pulse laser beam.

3. The method as claimed in claim 1, further comprising:

positioning a front side of the second beam profile region in front of the third beam profile region;

positioning a rear side of the second beam profile region in a rear side of the third beam profile region;

positioning a front side of the first beam profile region in front of the second beam profile region; and positioning a rear side of the first beam profile region in a rear side of the second beam profile region.

4. The method as claimed in claim 3, further comprising irradiating the laser beam that was an energy density gradient of a first boundary between the third beam profile region and the front side of the second beam profile region that is larger than an energy density gradient of a second boundary between the third beam profile region and the rear side of the second beam profile region.

5. The method as claimed in claim 3, further comprising irradiating the laser beam so that at least one of the front side of the second beam profile region and the front side of the first beam profile region has a constant energy density profile.

6. The method as claimed in claim 5, further comprising scanning the pulse laser beam at a pitch which is less than or equal to a width of the constant energy density profile region.

7. The method as claimed in claim 1, further comprising scanning the pulse laser beam at a pitch which is less than or equal to a width of the third beam profile region.

8. A device for irradiating a pulse laser beam comprising:

means for irradiating a semiconductor thin film with a pulse laser beam, said pulse laser beam comprising a first, second, and third beam profile regions, said first beam profile region having a first energy density which is lower than a micro-crystallization threshold value Ea of an amorphous semiconductor, the first beam profile region forming a polycrystallization region, said second beam profile region having a second energy density which is greater than or equal to the micro-crystallization threshold value Ea and is lower than a micro-crystallization threshold value Ep of a polycrystalline semiconductor, second beam profile region forming a first micro-polycrystallization region from an amorphous semiconductor region, and said third beam profile region having a third energy density which is greater than or equal to the micro-crystallization threshold value Ep, the third beam profile region forming a second micro-polycrystallization region from a polycrystalline semiconductor region; and means for scanning said pulse laser beams so that a first beam spot and a second beam spot partially overlap.

9. A method of double pulse irradiating first and second pulse laser beams comprising the steps of:

emitting the first and second pulse laser beams from different sources in sequence onto the same point of a non-single crystal semiconductor thin film;

scanning the first and second pulse laser beams so that a first and a second beam spot partially overlap along a width direction perpendicular to a scanning direction;

emitting the first laser beam with a first beam profile comprising at least a third beam profile region having a third energy density which is greater than or equal to the micro-crystallization threshold value Ep for forming a second micro-crystallization region from polycrystalline semiconductor region; and emitting the second laser beam with a second beam profile comprising a first beam profile region having a first energy density which is lower than a micro-crystallization threshold value Ea of an amorphous semiconductor for forming a polycrystallization region, and a second beam profile region having a second energy density which is greater than or equal to the micro-crystallization threshold value Ea and is lower than a micro-crystallization threshold value Ep of a polycrystalline semiconductor for forming a first micro-polycrystalline crystallization region from an amorphous semiconductor region.

10. The method as claimed in claim 9, further comprising irradiating the first and second laser beams so that at least one of the second beam profile region and the first beam profile region has a constant energy density profile.

11. The method as claimed in claim 10, further comprising irradiating the first and second laser beams so that a width of the constant energy density profile region is less than or equal to a width of the third beam profile region of the first pulse laser beam.

12. The method as claimed in claim 10, further comprising scanning the first and second pulse laser beams at a pitch that is less than or equal to a width of the constant energy profile region.

13. The method as claimed in claim 9, further comprising irradiating the first and second laser beams so that a time interval of the first and second pulse laser beams is less than or equal to a time interval between first and second irradiations of the first pulse laser beam.

14. A device for double pulse irradiating a first and second pulse laser beam comprising:

means for emitting the first and second pulse laser beams from different sources in sequence onto the same point of a non-single crystal semiconductor thin film;

means for scanning the first and second pulse laser beams so that a first and second beam spot partially overlap along a width direction perpendicular to a scanning direction;

means for emitting the first laser beam with a first beam profile comprising at least a third beam profile region having a third energy density which is greater than or equal to the micro-crystallization threshold value Ep for forming a second micro-crystallization region from a polycrystalline semiconductor region; and means for emitting the second laser beam with the second beam profile comprising a first beam profile region having a first energy density which is lower than a micro-crystallization threshold Ea of an amorphous semiconductor for forming a polycrystallization region, and a second beam profile region having a second energy density which is greater than or equal to the micro-crystallization threshold value Ea and is lower than a micro-crystallization threshold value Ep of a polycrystalline semiconductor for forming a first micro-polycrystallization region from an amorphous semiconductor region.

* * * * *